(12) United States Patent
Chuang et al.

(10) Patent No.: US 10,938,133 B2
(45) Date of Patent: Mar. 2, 2021

(54) HIGH FREQUENCY OPTIMIZED CONNECTOR

(71) Applicants: NICECONN TECHNOLOGY CO., LTD., New Taipei (TW); Yi-Fang Chuang, New Taipei (TW); Nai-Chien Chang, New Taipei (TW)

(72) Inventors: Yi-Fang Chuang, New Taipei (TW); Nai-Chien Chang, New Taipei (TW)

(73) Assignees: NICECONN TECHNOLOGY CO., LTD., New Taipei (TW); Yi-Fang Chuang, New Taipei (TW); Nai-Chien Chang, New Taipei (TW)

( * ) Notice: Subject to any disclaimer, the term of this patent is extended or adjusted under 35 U.S.C. 154(b) by 0 days.

(21) Appl. No.: 16/410,966

(22) Filed: May 13, 2019

(65) Prior Publication Data

US 2019/0356069 A1 Nov. 21, 2019

(30) Foreign Application Priority Data

May 16, 2018 (TW) .................. 107116685

(51) Int. Cl.
| | |
|---|---|
| *H01R 13/648* | (2006.01) |
| *H01R 4/58* | (2006.01) |
| *H01R 12/58* | (2011.01) |
| *H01R 12/71* | (2011.01) |
| *H01R 13/6471* | (2011.01) |
| *H01R 13/03* | (2006.01) |
| *H01R 13/646* | (2011.01) |

(52) U.S. Cl.
CPC ........... *H01R 12/58* (2013.01); *H01R 12/716* (2013.01); *H01R 13/03* (2013.01); *H01R 13/646* (2013.01); *H01R 13/6471* (2013.01)

(58) Field of Classification Search
CPC ... H01R 13/6594; H01R 24/60; H01R 12/721
USPC .............................. 439/78, 83, 941
See application file for complete search history.

(56) References Cited

U.S. PATENT DOCUMENTS

| | | | |
|---|---|---|---|
| 7,985,103 B2* | 7/2011 | Straka ................ | H01R 13/6466 439/676 |
| 2016/0104957 A1* | 4/2016 | Kim .................... | H01R 13/5219 439/78 |
| 2020/0099175 A1* | 3/2020 | Toda ...................... | H01R 12/52 |

\* cited by examiner

*Primary Examiner* — Abdullah A Riyami
*Assistant Examiner* — Thang H Nguyen
(74) *Attorney, Agent, or Firm* — Chun-Ming Shih; HDLS IPR Services

(57) ABSTRACT

A high frequency optimized connector including a circuit board having a top surface and a bottom surface is disclosed. A first golden finger set is placed on the top surface. A second golden finger set is placed on the bottom surface. The first golden finger set includes multiple data golden fingers and multiple auxiliary golden fingers. One end of each data golden finger is placed on a front section of the top surface, while the other end is connected from the front section of the top surface to the bottom surface through multiple middle through holes. One end of each auxiliary golden finger is placed on the front section, while the other end is extended to a rear section of the top surface through multiple first extension lines and is connected from the rear section to the bottom surface through multiple terminal through holes on the circuit board.

10 Claims, 4 Drawing Sheets

HIGH FREQUENCY OPTIMIZED CONNECTOR

TECHNICAL FIELD

The present invention relates to a connector and, in particular, to a connector realized by using a circuit board.

BACKGROUND

A connector is an important medium between two electronic devices for transmitting data and signals. Most electronic devices (e.g. laptops, tablet computers, mobile phones, GPS equipment) are equipped with at least one connector for communicating with other electronic devices.

However, with the development of technology, the connector has a smaller size but has more terminals. The connector also needs to allow for high speed data transmission. Consequently, designing and producing the connector is more and more difficult. In solution, a connector realized by using a circuit board was invented to replace the conventional connector having a plastic housing coupled to a metal terminal.

Please refer to FIG. 1 which is a schematic view of a related-art connector. FIG. 1 illustrates a connector 1 realized by using a circuit board and also illustrates a motherboard 2 using the connector 1. In the embodiment of FIG. 1, the connector 1 is a USB Type-C female connector as an example; however, the present invention is not limited in this regard.

Referring to FIG. 1, the connector 1 includes a circuit board 11. A plurality of golden fingers 111 are disposed on a front section of a top surface of the circuit board 11 and a front section of a bottom surface of the circuit board 11. Through a plurality of connection lines 112, the golden fingers 111 are extended to respective rear sections of the top surface and the bottom surface. The connector 1 further includes a first connection terminal set 12 electrically connected to the golden fingers 111 on the bottom surface and includes a second connection terminal set 13 electrically connected to the golden fingers 111 on the top surface. The connector 1 is electrically connected to the mother board 2 through the first connection terminal set 12 and the second connection terminal set 13. By this way, the motherboard 2 and other electronic devices (not labelled) can proceed data and signal transmission therebetween through the connector 1.

However, as shown in FIG. 1, the connector 1 lacks the plastic housing, so the golden fingers 111 and/or the connection lines 112 on the circuit board 11 are directly exposed (in particular, the golden fingers 111 and/or the connection lines 112 on the top surface of the circuit board 11) to the outside. This causes a serious high frequency effect. As a result, this kind of connector 1 often does not have a good testing result, leading to low production yield and difficulty in gaining popularity.

SUMMARY

It is an objective of the present invention to provide a high frequency optimized connector. Due to special line configurations for some golden fingers, the connector can overcome a high frequency effect and meet the testing standard.

Accordingly, the high frequency optimized connector includes a circuit board having a bottom surface and a bottom surface. A first golden finger set is disposed on the top surface, and a second golden finger set is disposed on the bottom surface. The first golden finger set includes a plurality of data golden fingers and a plurality of the auxiliary golden fingers. One end of each data golden finger is disposed on a front section of the top surface. The other end of each data golden finger is connected from the front section of the top surface to the bottom surface of the circuit board through a plurality of middle through holes on the circuit board. One end of each auxiliary golden finger is disposed on the front section of the top surface, and the other end of each auxiliary golden finger is extended to a rear section of the top surface through a plurality of first extension lines on the top surface. The other end of each auxiliary golden finger is connected from the rear section of the top surface to the bottom surface of the circuit board through a plurality of terminal through holes on the circuit board.

Through the middle through holes, the data golden fingers on the top surface of the circuit board are connected to the bottom surface of the circuit board. Then, by using the lines on the bottom surface, the data golden fingers on the top surface are extended to desired locations on the circuit board. Compared to conventional techniques, the present invention effectively reduces a high frequency effect for the data golden fingers on the top surface, and thereby the connector can pass testing, comply with testing standard and have improved production yield.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present disclosure are illustrated below in conjunction with the accompanying drawings. However, it is to be understood that the descriptions and the accompanying drawings disclosed herein are merely illustrative and exemplary and not intended to limit the scope of the present disclosure.

Figure 1:
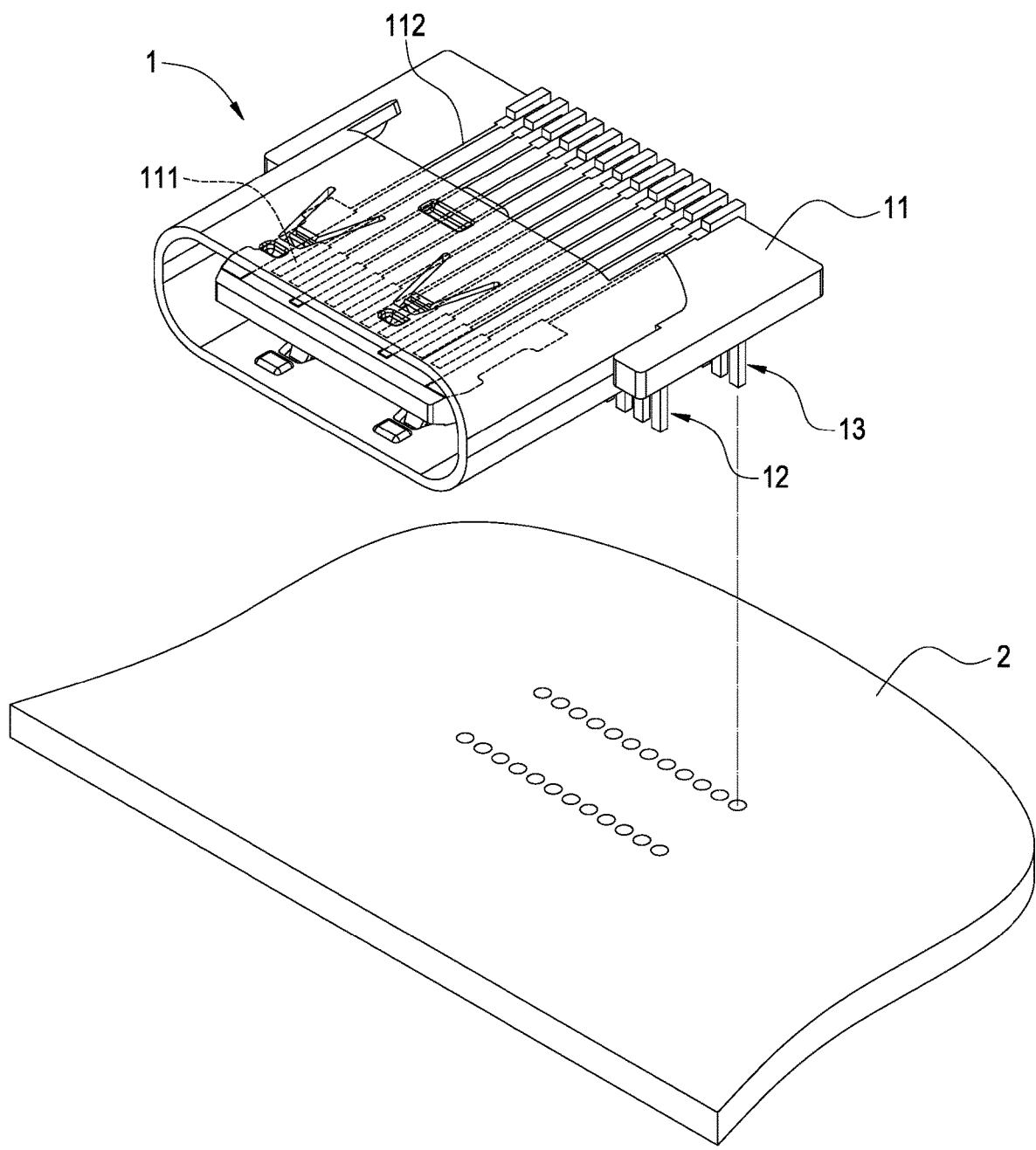
FIG. 1 is a schematic view illustrating a connector using related technology.
Figure 2:
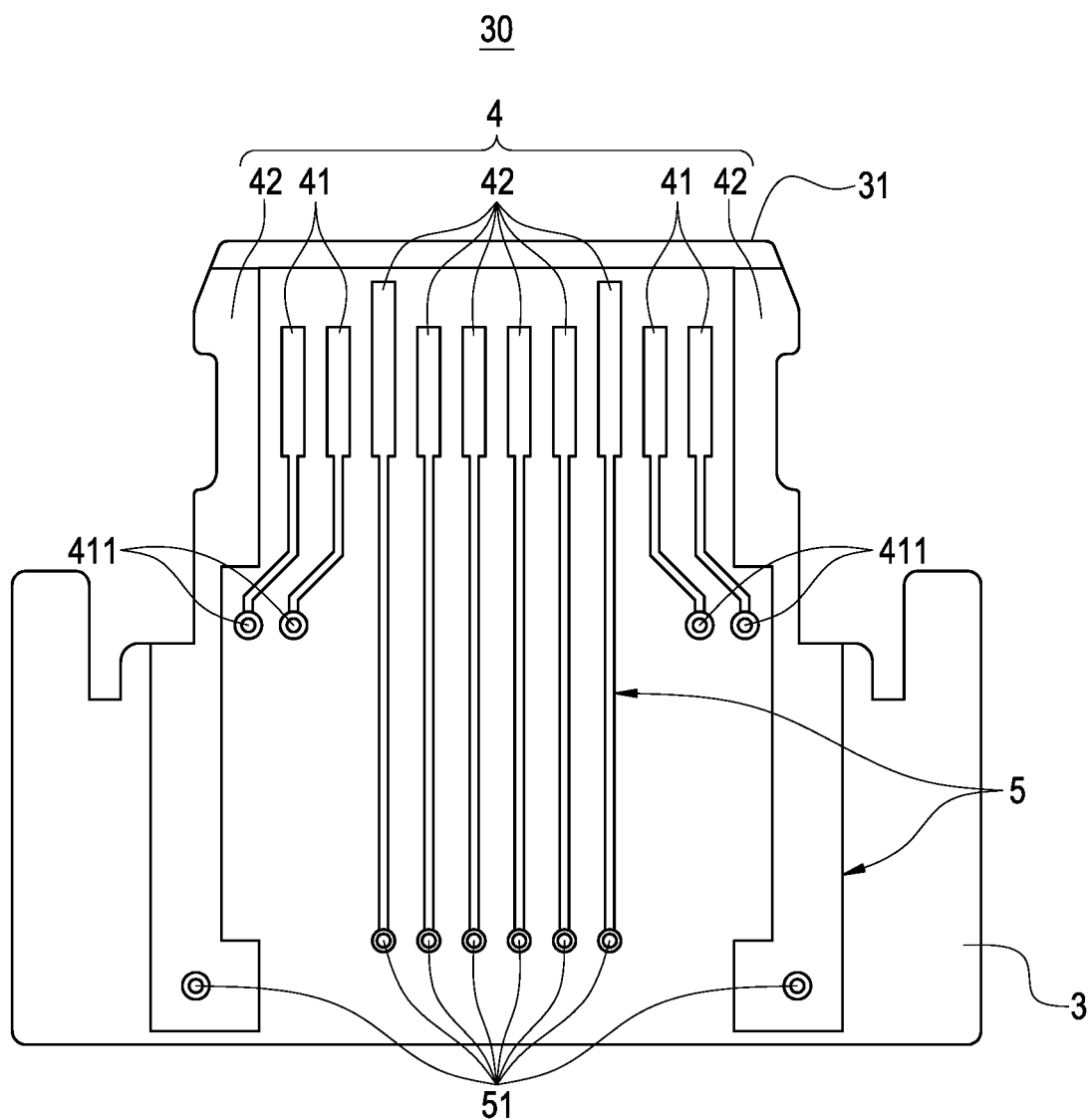
FIG. 2 is a top view illustrating a circuit board of a high frequency optimized connector according to the first embodiment of the present invention.
Figure 3:
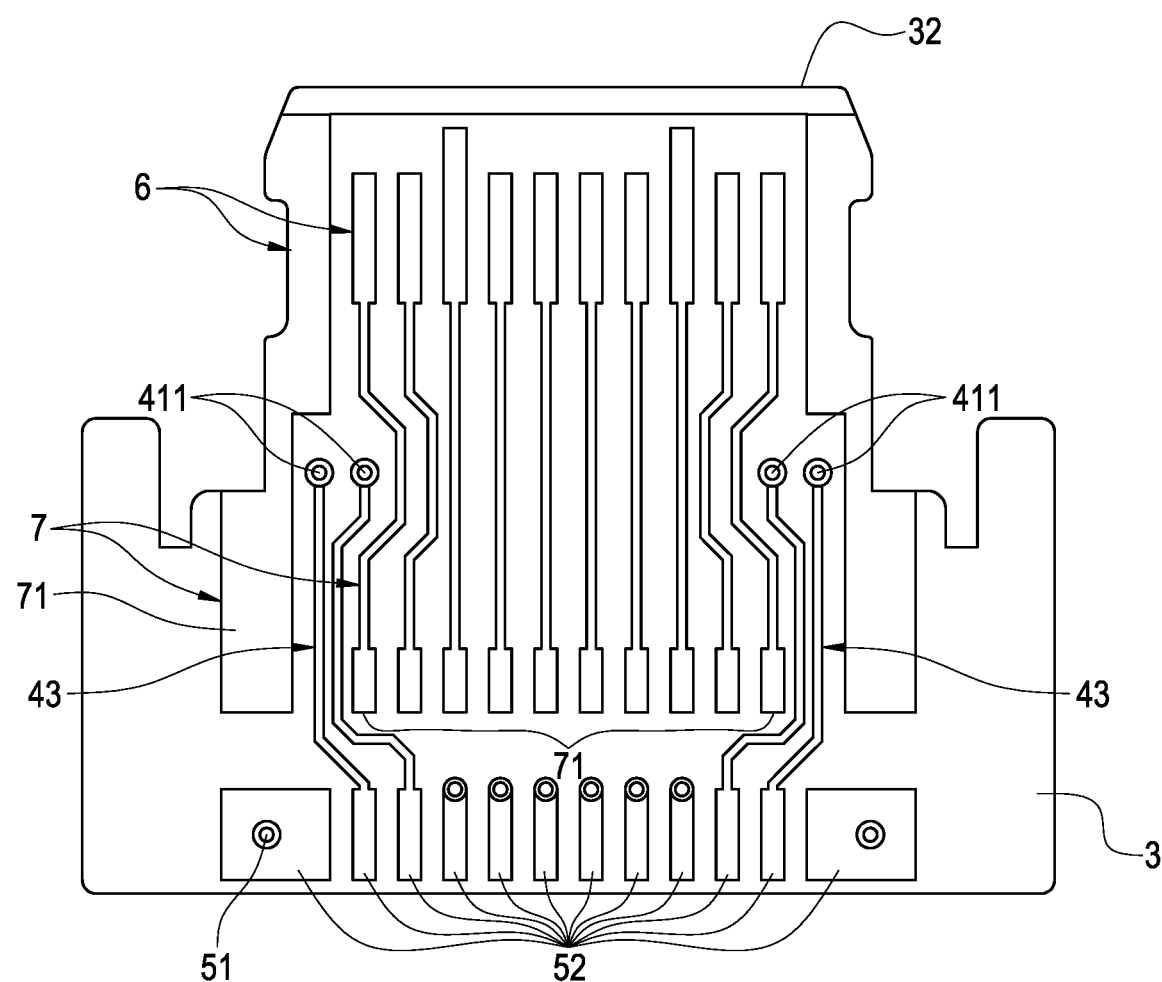
FIG. 3 is a bottom view illustrating the circuit board according to the first embodiment of the present invention.

Please refer to FIGS. 2 and 3 for a top view and a bottom view illustrating a circuit board according to the first embodiment of the present invention. In the drawings, a high frequency optimized connector (hereinafter briefly referred to as connector 30). The connector 30 at least includes a circuit board 3, a first golden finger set 4 and a second golden finger set 6. The circuit board 3 has a top surface 31 and a bottom surface 32. The first golden finger set 4 is disposed on the top surface 31 of the circuit board 3, and the second golden finger set 6 is disposed on the bottom surface 32 of the circuit board 3.

Referring to FIG. 2, the first golden finger set 4 includes a plurality of top golden fingers. In the present embodiment, there are twelve top golden fingers as an example; the present invention is not limited in this regard. The top golden fingers include a plurality of data golden fingers 41 and a plurality of auxiliary golden fingers 42. One main technical feature of the present invention is that the data golden fingers 41 and the auxiliary golden fingers 42 have different line configurations on the top surface 31.

According to one embodiment of the present invention, one end of each data golden finger 41 is disposed on a front section of the top surface 31 of the circuit board 3, and the other end of each data golden finger 41 is connected from the front section of the top surface 31 to the bottom surface 32 of the circuit board 3 through a plurality of middle through holes 411 on the circuit board 3. One end of each auxiliary golden finger 42 is disposed on the front section of the top surface 31, and the auxiliary golden fingers 42 are juxtaposed with the data golden fingers 41.

A plurality of first extension lines 5 are disposed on the top surface 31 of the circuit board 3. In the present embodiment, the number of the first extension lines 5 is equal to the number of the auxiliary golden fingers 42. The other end of each auxiliary golden finger 42 is extended to a rear section of the top surface 31 of the circuit board 3 through a plurality of first extension lines 5. The other end of each auxiliary golden finger 42 is connected from the rear section of the top surface 31 to the bottom surface 32 of the circuit board 3 through a plurality of terminal through holes 51, thereby forming a plurality of first conductive points 52 (see FIG. 3) on the bottom surface 32.

In one embodiment, the auxiliary golden fingers 42 and the first extension lines 5 are integrally formed (or in one-piece form). In another embodiment, the auxiliary golden fingers 42 and the first extension lines 5 are separately disposed and electrically connected to each other on the top surface 31; the present invention is not limited in this regard.

In the present invention, the data golden fingers 41 are directly connected to the bottom surface 32 of the circuit board 3 through the middle through holes 411 on the front section of the circuit board 3. As a result, much less area of the data golden fingers 41 on the top surface 31 of the circuit board 3 is directly exposed to the outside from the connector 30, which efficiently reduces a high frequency effect.

As shown in FIG. 3, the second golden finger set 6 includes a plurality of bottom golden fingers. In the present embodiment, there are twelve bottom golden fingers as an example; however, the present invention is not limited in this regard. One end of each bottom golden finger is disposed on a front section of the bottom surface 32 of the circuit board 3, and the other end of each bottom golden finger is extended to a rear section of the bottom surface 32 of the circuit board 3 through a plurality of second extension lines 7 on the bottom surface 32, thereby forming a plurality of second conductive points 71 on the rear section of the bottom surface 32. In one embodiment, the bottom golden fingers and the second extension lines 7 are integrally formed (or in one-piece form). In another embodiment, the bottom golden fingers and the second extension lines 7 are separately disposed and electrically connected to each other on the bottom surface 32; however, the present invention is not limited in this regard. Moreover, the number of the second extension lines 7 is equal to the number of the bottom golden fingers.

Figure 4:
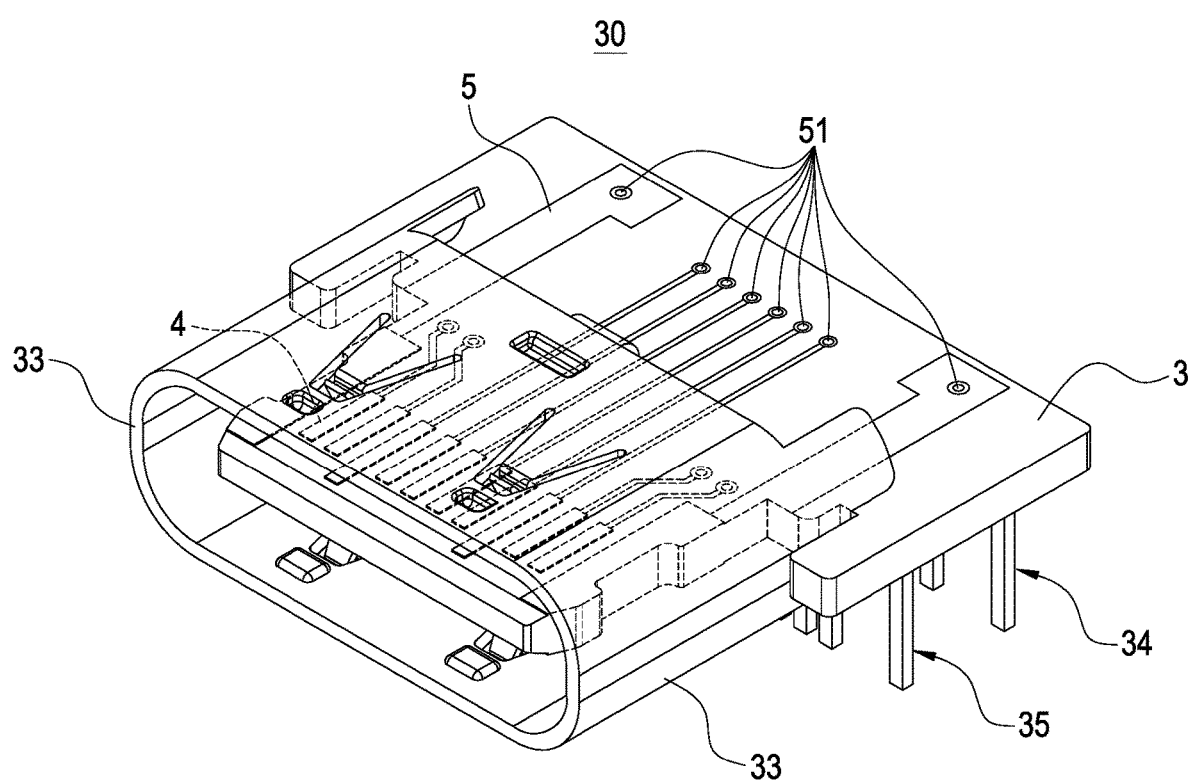
FIG. 4 is a schematic view illustrating the high frequency optimized connector according to the first embodiment of the present invention.

Please refer to FIG. 4 for a schematic view illustrating the connector 30 according to the first embodiment of the present invention. The connector 30 further includes a first connection terminal set 34 and a second connection terminal set 35. The first connection terminal set 34 includes a plurality of first connection terminals electrically connected to the first conductive points 52 on the bottom surface 32 of the circuit board 3 respectively to thereby be electrically connected to the first golden finger set 4. The second connection terminal set 35 includes a plurality of second connection terminals for electrically connected to the second conductive points 71 on the bottom surface 32 of the circuit board 3 to thereby be electrically connected to the second golden finger set 6.

As shown in FIG. 3, a plurality of substitute extension lines 43 are disposed on the bottom surface 32 of the circuit board 3. The number of the substitute extension lines 43 is equal to the number of the data golden fingers 41 in the first golden finger set 4. In the present embodiment, one end of each substitute extension line 43 is electrically connected to the respective corresponding one of the middle through holes 411 on the bottom surface 32 of the circuit board 3. Accordingly, the middle through holes 411 are extended, through the respective substitute extension lines 43, to the respective terminal through holes 51 on the bottom surface 32 and form a portion of the first conductive points 52 there.

In the present embodiment, the first golden finger set 4 includes twelve top golden fingers in total (including multiple data golden fingers 41 and multiple auxiliary golden fingers 42). The second golden finger set 6 includes twelve bottom golden fingers in total. The connector 30 is a USB Type-C connector. As shown in FIGS. 2 and 3, in the present embodiment, the number of the substitute extension lines 43 is four, the number of the first extension lines 5 is eight. In other words, the number of the data golden fingers is four, and the number of the auxiliary golden fingers 42 is eight. Moreover, the number of the second extension lines 7 is twelve; however, the present invention is not limited in this regard.

It should be noted that, in one embodiment, a distance from the second conductive points 71 to the front section of the bottom surface 32 is shorter than a distance from the first conductive points 52 to the front section of the bottom surface 32. However, in alternative embodiments, the positions of the first conductive points 52 and the second conductive points 71 can be adjusted to make the distance from the conductive points 52 to the front section of the bottom surface 32 shorter than the distance from the second conductive points 71 to the front section of the bottom surface 32. The present invention is not limited in this regard.

As mentioned above, the connector 30 is a USB Type-C connector as an example in one embodiment. A table of the USB Type-C specification is provided below.

| A1 | A2 | A3 | A4 | A5 | A6 | A7 | A8 | A9 | A10 | A11 | A12 |
|---|---|---|---|---|---|---|---|---|---|---|---|
| GND | SSTxp1 | SSTxn1 | VBUS | CC1 | Dp1 | Dn1 | SBU1 | VBUS | SSRxn2 | SSRxp2 | GND |
| B12 | B11 | B10 | B9 | B8 | B7 | B6 | B5 | B4 | B3 | B2 | B1 |
| GND | SSRxp1 | SSRxn1 | VBUS | SBU2 | Dn2 | Dp2 | CC2 | VBUS | SSTxn2 | SSTxp2 | GND |

In the above table, A1 to A12 are the first golden finger set 4 mentioned above. B1 to B12 are the second golden finger set 6 mentioned above. In one embodiment, the data golden fingers 41 are the second golden finger (A2), the third golden finger (A3), the tenth golden finger (A10) and the eleventh golden finger (A11) in the first golden finger set 4.

In detail, in one embodiment, the data golden fingers 41 are a first SuperSpeed positive-differential-signal golden finger (SSTxp1), a first SuperSpeed negative-differential-signal golden finger (SSTxn1), a second SuperSpeed positive-differential-signal golden finger (SSTxp2), and a second SuperSpeed negative-differential-signal golden finger (SSTxn2) in the first golden finger set 4.

As mentioned before, the main technical feature of the present invention is that, the data golden fingers 41 on the top surface 31 of the circuit board 3 are connected, directly from the front section of the top surface 31, to the bottom surface 32 of the circuit board 3. Then, through the substitute extension lines 43 on the bottom surface 32, the data golden fingers 41 are extended to the first conductive points 52 to be connected to the first connection terminal set 34. By this way, in normal conditions (i.e. the top surface 31 of the circuit board 3 faces upwards, the bottom surface 32 faces toward a mother board connected), the data golden fingers 41 (i.e. A2, A3, A10 and A11 in the above table) in the first golden finger set 4 and the data golden fingers (i.e. B2, B3, B10 and B11 in the above table) in the second golden finger set 6 are covered by the circuit board, and a large amount of area is prevented from being directly exposed to the outside, thus greatly reducing a high frequency effect, and therefore the connector 30 can successfully pass the circuit testing.

To be specific, as shown in FIG. 4, the connector 30 further includes a metal casing 33. The metal casing (shell) 33 is used to cover the front section of the top surface 31 and the front section of the bottom surface 32 of the circuit board 3. In one embodiment, in order to save costs, the metal casing 33 does not cover the whole circuit board 3. Therefore, the metal casing 33 only covers the first golden finger set 4 and the second golden finger set 6 at the front section of the circuit board 3, and does not cover the first extension lines 5, the second extension lines 7 and the substitute extension lines 43. As shown in FIG. 4, on the top surface 31 of the circuit board 3, the twelve golden fingers (i.e. the first golden finger set 4) are covered by the metal casing 33, and only eight connection lines (i.e. the first extension lines 5) are not covered by the metal casing 33.

In the present embodiment, a length of each data golden finger 41 is shorter than a length (i.e. a distance from a front opening of the metal casing 33 to a rear opening of the metal casing 33) of the metal casing 33. As a result, the middle through holes 411 on the circuit board 3 are covered by the metal casing 33. By this configuration, the data golden fingers 41 in the first golden finger set 4 of the connector 30 are disposed on the top surface 31 of the circuit board 3 and are covered by the metal casing 33. The substitute extension lines 43, used for extending the data golden fingers 41 to the first conductive points 52, are disposed on the bottom surface 32 of the circuit board 3 but can be covered by the circuit board 3. Accordingly, the connector 30 can effectively reduce a high frequency effect.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A high frequency optimized connector, comprising:
    a circuit board having a top surface and a bottom surface;
    a first golden finger set disposed on the top surface, the first golden finger set including a plurality of data golden fingers and a plurality of auxiliary golden fingers, one end of each data golden finger being disposed on a front section of the top surface, the other end of each data golden finger being connected from the front section of the top surface to the bottom surface through a plurality of middle through holes, one end of each auxiliary golden finger being disposed on the front section of the top surface, the other end of each auxiliary golden finger being extended to a rear section of the top surface through a plurality of first extension lines on the top surface, the other end of each auxiliary golden finger being connected from the rear section of the top surface to the bottom surface through a plurality of terminal through holes to thereby form a plurality of first conductive points on the bottom surface;
    a second golden finger set disposed on the bottom surface, the second golden finger set including a plurality of bottom golden fingers, one end of each bottom golden finger being disposed on a front section of the bottom surface, the other end of the bottom golden finger being extended to a rear section of the bottom surface through a plurality of second extension lines on the bottom surface to form a plurality of second conductive points;
    a first connection terminal set, the first connection terminal set including a plurality of first connection terminals electrically connected to the first conductive points respectively; and
    a second connection terminal set, the second connection terminal set including a plurality of second connection terminals electrically connected to the second conductive points respectively.

2. The high frequency optimized connector according to claim 1, wherein the first golden finger set includes twelve top golden fingers, the second golden finger set includes twelve bottom golden fingers, and the high frequency optimized connector is a USB Type-C connector.

3. The high frequency optimized connector according to claim 2, wherein the data golden fingers are the second, third, tenth and eleventh of the twelve top golden fingers.

4. The high frequency optimized connector according to claim 2, wherein the data golden fingers are a first SuperSpeed positive-differential-signal golden finger (SSTxp1), a first SuperSpeed negative-differential-signal golden finger (SSTxn1), a second SuperSpeed positive-differential-signal golden finger (SSTxp2), and a second SuperSpeed negative-differential-signal golden finger (SSTxn2) in the twelve top golden fingers.

5. The high frequency optimized connector according to claim 4, further comprising a metal casing covering the front section of the top surface and the front section of the bottom surface of the circuit board.

6. The high frequency optimized connector according to claim 5, wherein the middle through holes are extended, through a plurality of substitute extension lines on the bottom surface, to the terminal through holes on the bottom surface to form a portion of the first conductive points.

7. The high frequency optimized connector according to claim 6, wherein the number of the first extension lines is eight, the number of the substitute extension lines is four, the number of the second extension lines is 12, the number of the first conductive points is 12, and the number of the second conductive points is 12.

8. The high frequency optimized connector according to claim 7, wherein a distance from each second conductive point to the front section of the bottom surface is shorter than a distance from each first conductive point to the front section of the bottom surface.

9. The high frequency optimized connector according to claim 5, wherein a length of each of the data golden fingers is shorter than a length of the metal casing.

10. The high frequency optimized connector according to claim 5, wherein the middle through holes are covered by the metal casing.

* * * * *